United States Patent [19]

Isogai

[11] 4,385,370

[45] May 24, 1983

[54] DECODER CIRCUIT

[75] Inventor: Hideaki Isogai, Higashikurume, Japan

[73] Assignee: Fujitsu Limited, Kawasaki, Japan

[21] Appl. No.: 179,794

[22] Filed: Aug. 20, 1980

[30] Foreign Application Priority Data

Aug. 22, 1979 [JP] Japan ................................. 54/106920

[51] Int. Cl.³ .............................................. G11C 8/02
[52] U.S. Cl. ...................................... 365/230; 307/467
[58] Field of Search ................ 365/189, 230; 307/446, 307/463, 466, 467, 475

Primary Examiner—George G. Stellar
Attorney, Agent, or Firm—Staas & Halsey

[57] ABSTRACT

A decoder circuit for a semiconductor memory device includes a plurality of input terminal gates for receiving address signal bits and for producing the same signal as well as inverted signals thereof; first decoder lines for decoding output signals of some of the input terminal gates; and diode matrices or multi-emitter transistors of which one terminal is connected to any decoder line selected from the first decoder lines, and of which another terminal is connected via a resistor to a power source and to the base of transistors which drive a group of output terminal gates. The diode matrices or multi-emitter transistors being capable of turning the transistor on or off depending upon the potential of the first decoder lines. The decoder circuit provides second decoder lines to which are connected constant current sources; emitter follower-connected transistors which are inserted between the power source and the second decoder lines, and which are turned on or off by the output signals of the remainder of the input terminal gates; and diode matrices or multi-emitter transistors of which one terminal is connected to any decoder line selected from the second decoder lines, and of which another terminal is connected via a resistor to the emitter of the transistor for driving the group of the output terminal gates and to the base of an output transistor. The diode matrices or the multi-emitter transistors being capable of turning the output transistor on or off depending upon the potential of the second decoder lines and upon the emitter potential of the transistor which drives the group of the output terminal gates.

8 Claims, 13 Drawing Figures

DECODER CIRCUIT

FIELD OF THE INVENTION

The present invention relates to a decoder circuit for a semiconductor memory device, which is constructed so as to meet the requirements of low power consumption and high-speed operation.

BACKGROUND OF THE INVENTION

Japanese Patent Application No. 50-84820 (Japanese Patent Laid-Open No. 52-8739) discloses a system which utilizes emitter coupled logic (ECL) and a diode (or a multi-emitter) matrix, and which selects or does not select the diode matrix in a two-dimensional or higher dimensional manner, in order to reduce the consumption of electric power and the number of elements in the decoder circuit.

The decoder circuit mentioned-above is advantageous with regard to reduced power consumption and to a reduced number of element compared to conventional decoder circuits. However, it has a defect in that the output level rises and falls slowly, since the decoder lines are very lengthy as they run over the groups of memory cells and, hence, possess a large capacitance. Therefore, when the reading level is higher than a point at which the output waveform rises slowly, the access time tends to be delayed.

OBJECTS AND SUMMARY OF THE INVENTION

An object of the present invention is to provide a decoder circuit having output waveforms which rise and fall rapidly.

Another object of the present invention is to provide a decoder circuit which can operate at high speed.

The above-mentioned objects are achieved by a decoder circuit for a semiconductor memory device, comprising, a plurality of input terminal gates for receiving address signal bits and for producing the same signals as well as inverted signals thereof; first decoder lines for decoding output signals of some of the input terminal gates; and diode matrices or multi-emitter transistors of one terminal is connected to any decoder line which selected from the first decoder lines, and of which another terminal is connected via a resistor to a power source and to the base of transistors which drive a group of output terminal gates. The diode matrices or the multi-emitter transistors being capable of turning the transistor on or off depending upon the potential of the first decoder lines. The decoder further comprises second decoder lines to which are connected constant current sources emitter follower-connected transistors which are inserted between the power source and the second decoder lines, and which are turned on or off by the output signals of the remainder of the input terminal gates; and diode matrices or multi-emitter transistors of which one terminal is connected to any decoder line selected from the second decoder lines, and of which another terminal is connected via a resistor to the emitter of the transistor for driving the group of the output terminal gates and to the base of an output transistor. The diode matrices or the multi-emitter transistors being capable of turning the output transistor on or off depending upon the potential of the second decoder lines and upon the emitter potential of the transistor which drives the group of the output terminal gates.

Further features and advantages of the present invention will be apparent from the ensuing description with reference to the accompanying drawings to which, however, the scope of the invention is in no way limited.

DETAILED DESCRIPTION OF THE PREFERRED EMBODIMENT

Figure 1:
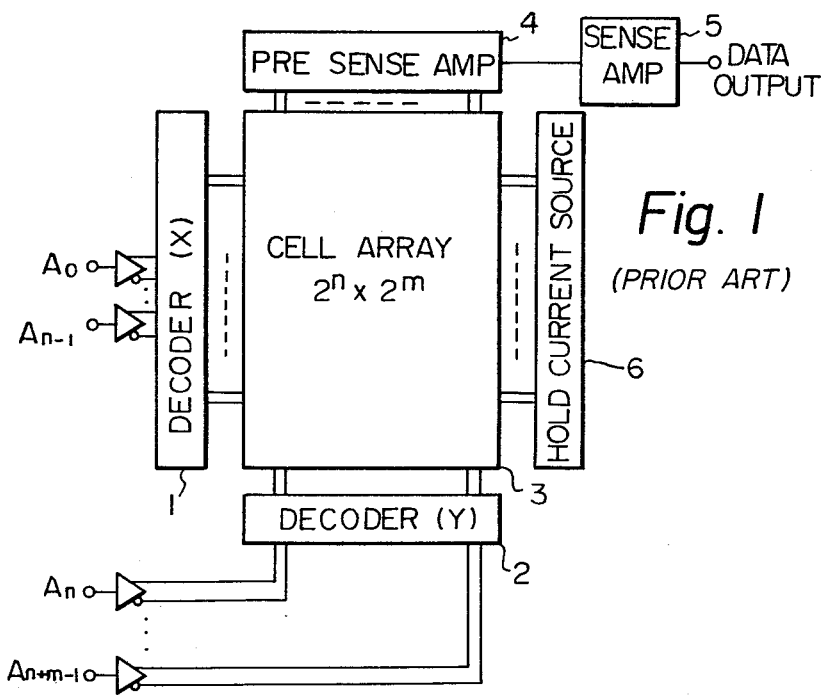
FIG. 1 is a block diagram of a memory device.

FIG. 1 illustrates the construction of an integrated circuit memory device. Referring to FIG. 1, a decoder (X) 1 and a decoder (Y) 2 are connected to a cell array 3. The decoder (X) 1 and the decoder (Y) 2 receive address signals $A_0 \ldots A_{n-1}$ and $A_n \ldots A_{n+m-1}$, respectively, and the cells arranged in matrix form are selected by the outputs of the decoder (X) 1 and the decoder (Y) 2. A presense amplifier 4 writes or reads the information from or into the cell selected from the outputs of the decoder (X) 1 and the decoder (Y) 2. The read data is amplified by the sense amplifier 5. A hold current source 6 is provided for holding the information in the memory cell in the cell array 3.

In the block diagram of FIG. 1, the output waveforms of the decoder circuit (X) 1 rise slowly. The object of the present invention is to improve the output waveform of the decoder circuit (X). Therefore, the present invention will be explained with respect to the problem caused in the decoder circuit (X) 1. Hereinafter, the decoder circuit (X) 1 is referred to as the decoder circuit.

Figure 2:
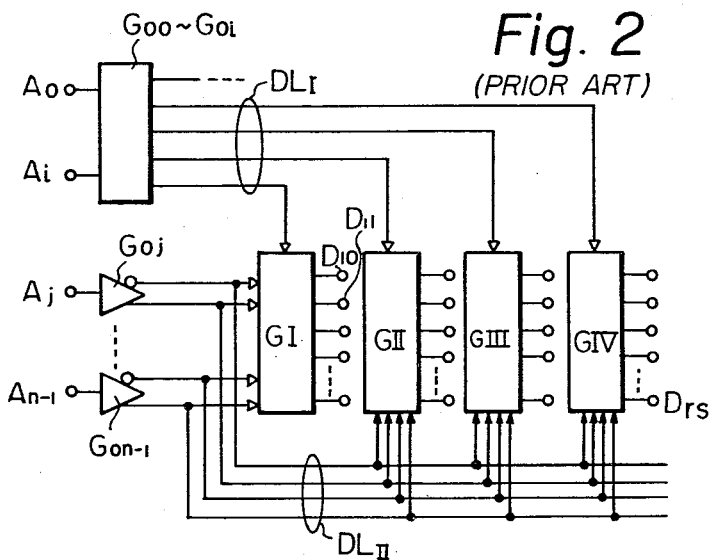
FIG. 2 is a block diagram of a decoder used in the memory device illustrated in FIG. 1.
Figure 3A:
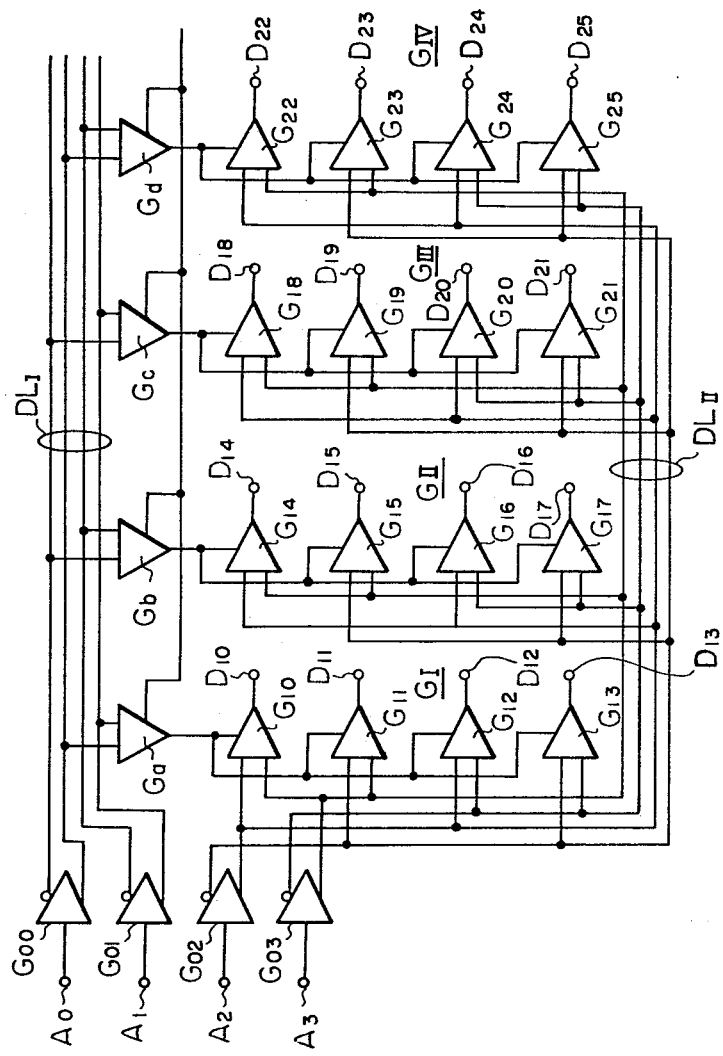
FIG. 3A is a circuit diagram of the decoder constructed to deal with four bit addresses.

FIG. 2 is a block diagram of a decoder of the above-mentioned matrix system, and FIG. 3A is a circuit diagram when the address consists of four bits. Referring to FIG. 2, gate circuits $G_{00}$ to $G_{0n-1}$ of the first stage are divided into two groups, i.e., $G_{00}$ to $G_{0i}$ and $G_{0j}$ to $G_{0n-1}$ which correspond to a plurality of upper bits and a plurality of lower bits of the input signals. Gate circuits $G_{10}$ to $G_{rs}$ of the second stage are also divided into a plurality of groups GI to GIV which correspond to the upper and lower bits. Binary signals of n bits are divided into upper digits 0 to i, and lower digits j to $n-1$. The former digits are fed to the upper gate circuits $G_{00}$ to $G_{0i}$ of the first stage so that their outputs will select the gate circuits of the groups GI to GIV of the second stage, and the latter digits are fed to the lower gate circuits $G_{0j}$ to $G_{0n-1}$ of the first stage so that their outputs are fed in parallel as decoding input signals to each of the gate circuits GI to GIV of the second stage, whereby any one of the gate circuits of the second stage is allowed to produce an output.

Figure 3B:
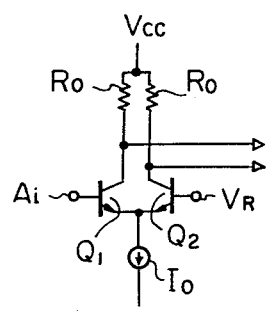
FIGS. 3B, 3C, 3D and 3E are circuit diagrams of conventional circuits used in the matrix-type decoder illustrated in FIG. 3A.
Figure 3C:
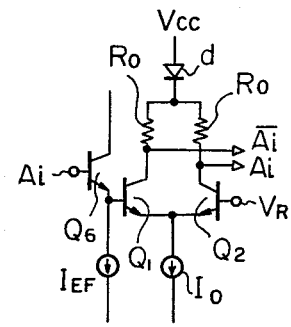
Figure 3D:
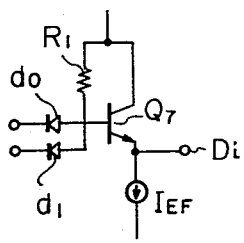
Figure 3E:
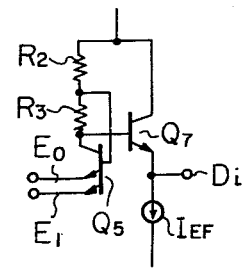

FIG. 3A illustrates a decoder circuit which is constructed so as to deal with four bit binary input signals, in which the symbols $G_{00}$, $G_{01}$, and $G_{02}$, $G_{03}$ denote four gate circuits of the first stage. The gate circuits of the former group form a differential amplifier circuit as illustrated in FIG. 3B, and the gate circuits of the latter group form a differential amplifier circuit as illustrated in FIG. 3C. The circuit illustrated in FIG. 3C has a transistor $Q_6$ which functions as an emitter follower in the input stage, and has load resistors $R_0$ which are connected to a power source $V_{CC}$ via a diode d. Symbols GI to GIV denote four groups of second-stage gate circuits, each group consisting of four second-stage gate circuits $G_{10}$ to $G_{13}$, $G_{14}$ to $G_{17}$, $G_{18}$ to $G_{21}$, and $G_{22}$ to $G_{25}$. The second-stage gate circuits $G_{10}$ to $G_{25}$ each consist of a diode matrix or a multi-emitter transistor circuit as illustrated in FIG. 3D or FIG. 3E, and have an emitter follower which comprises a transistor $Q_7$ on the output side. Symbols Ga to Gd denote decoders which receive binary output signals, each comprising two bits from the upper first-stage gate circuits $G_{00}$ to $G_{01}$, and which energize any one of the four second-stage gate circuit groups GI to GIV. The decoders Ga to Gd are constructed in the same manner and have the same function as the second-stage gate circuit groups GI to GIV.

Figure 4:
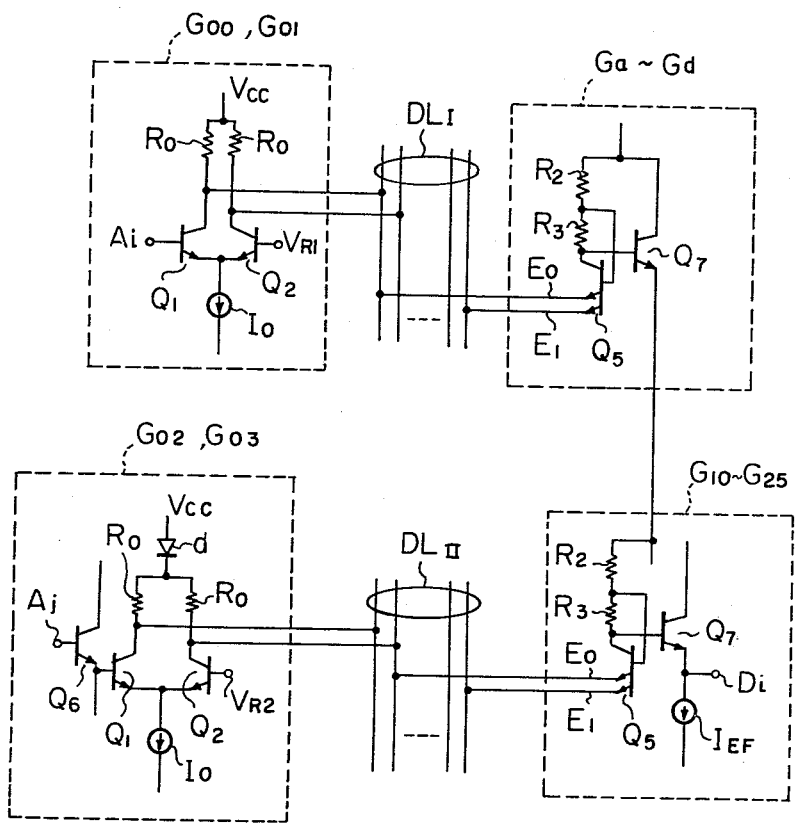
FIG. 4 illustrates a portion of a decoder circuit of FIG. 3A usng the conventional circuits of FIGS. 3B, 3C and 3E.
Figure 5:
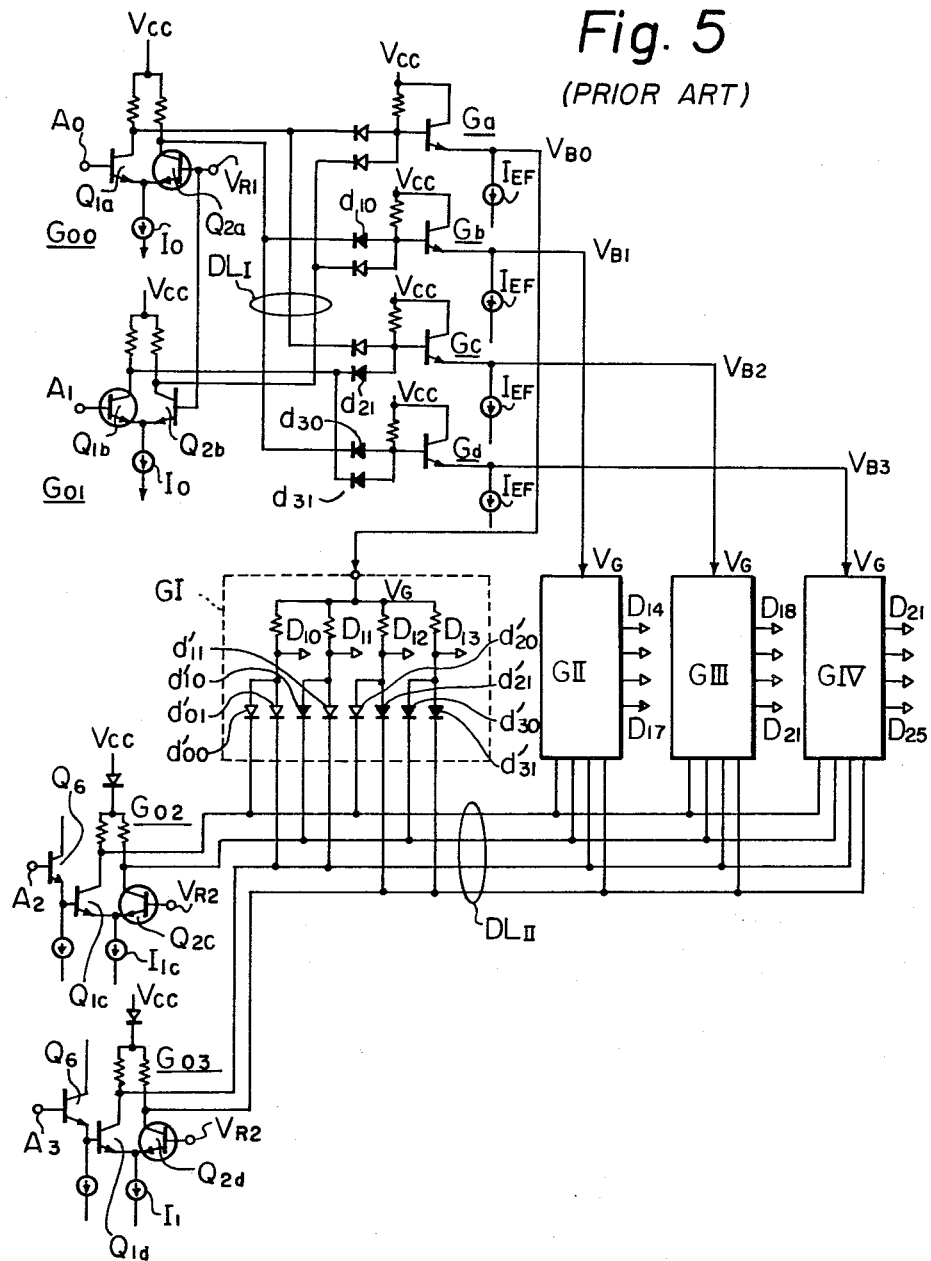
FIG. 5 illustrates a portion of a decoder circuit of FIG. 3A, using the conventional circuits of FIGS. 3B, 3C and 3D.

A portion of the decoder circuit of FIG. 3A is shown in FIG. 4, incorporating the circuits of FIGS. 3B, 3C and 3E; and a portion of the decoder circuit of FIG. 3A is shown in FIG. 5 incorporating the circuits of FIGS. 3B, 3C and 3D.

Next, the operation of the conventional decoder circuit will be explained with reference to the circuit illustrated in FIG. 5. Referring to FIG. 5, it is assumed that the input signals $A_0$, $A_1$, $A_2$ and $A_3$ have L, H, L, L levels, respectively, where L denotes a low level and H denotes a high level. Logically, these input signals correspond to the values 0, 1, 0, 0, respectively. Of these input signals, the upper two bits 01 are supplied to the first gate circuits $G_{00}$ and $G_{01}$, so that the transistors $Q_{2a}$ and $Q_{1b}$ are placed in an on state. Accordingly, in the decoder circuits $G_a$, $G_b$, $G_c$ and $G_d$, the diodes $d_{10}$, $d_{21}$, $d_{30}$ and $d_{31}$ are placed in an on state, so that only the decoder circuit $G_a$ generates an output having a high level. The outputs $V_{B0}$, $V_{B1}$, $V_{B2}$ and $V_{B3}$ of the decoder circuits are supplied to the electric source terminals $V_G$ of the second stage decoder circuits GI~GIV, and while the decoder circuit GI is placed in an operative condition the other decoder circuits GII~GIV are placed in an inoperative condition. Thus, the second stage decoder circuit GI is selected by the upper two bits of the input signal.

The lower two bits of the input signal are supplied to the gate circuits $G_{02}$ and $G_{03}$, so that the transistors $Q_{2c}$ and $Q_{2d}$ are placed in the on state. Accordingly, the diodes $d'_{10}$, $d'_{21}$, $d'_{30}$ and $d'_{31}$ in the gate circuit GI are placed in the on state, so that only the output $D_{10}$ is placed at the high level.

When the input signals $A_0$~$A_3$ have another combination of H and L, similar to the above-mentioned operation any one of the outputs $D_{10}$~$D_{25}$ of the second gate circuits GI~GIV is placed in the high level state, so that 16 pieces of information included in four bit binary signal can be decoded.

Figure 6:
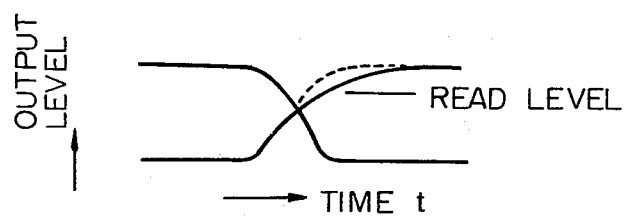
FIG. 6 is a diagram illustrating the waveform of the conventional decoder circuit.

A decoder circuit having a matrix type, as mentioned above, is advantageous with regard to reduced power consumption and to a reduced number of elements as compared to conventional decoder circuits, but has a defect in that the output level rises slowly. FIG. 6 illustrates the output waveform of the above-mentioned decoder circuit. When the output rises from the low level to the high level, it should ideally rise as indicated by the dotted line. In practice, however, the output assumes the waveform indicated by the solid line. Therefore, when the reading level is higher than a certain value, the access time tends to be delayed. That is, in conventional circuits, the output level rises slowly, since the decoder lines DLII are very lengthy as they run over the groups of memory cells and, hence, possess a large capacitance C. The level in the decoder lines DLII is raised when they are electrically charged by the power source $V_{CC}$ through resistors $R_0$ in the input terminal gates $G_{02}$, $G_{03}$. Therefore, the level in the decoder lines DLII rises slowly due to a time constant $R_0C$.

With reference to the matrix decoder circuit, furthermore, the potential in the output terminals $D_{10}$~$D_{25}$ should be at a low level when they are not selected. However, the potential in these output terminals tends to be slightly raised at the moment when the address is being switched. Therefore, the level of the decoder lines DLII rises slowly.

Figure 7:
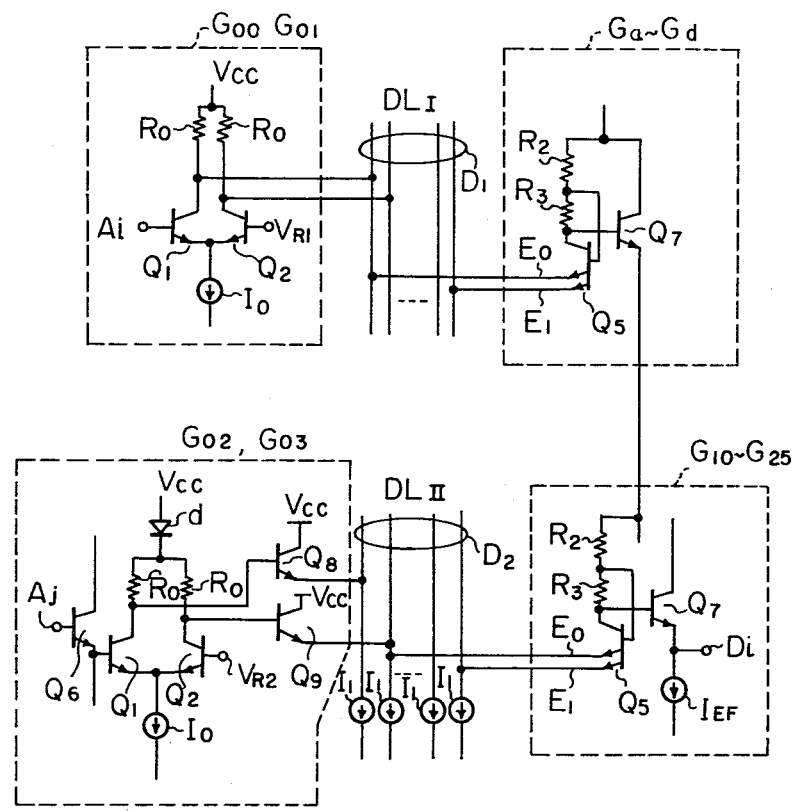
FIG. 7 is a circuit diagram illustrating the decoder according to one embodiment of the present invention.

FIG. 7 illustrates a decoder circuit in accordance with an embodiment of the present invention, in which the symbols which are the same as those in FIGS. 2 to 5 refer to the same elements. Symbols DLI and DLII denote decoder lines, $I_1$ denotes constant current sources, and $Q_8$ and $Q_9$ denote transistors connected in an emitter follower manner. The circuit of FIG. 7 is different from the conventional circuits in that the outputs of the first-stage gate circuits $G_{02}$, $G_{03}$ are connected to the decoder lines DLII via emitter-follower transistors $Q_8$, $Q_9$, and that constant current sources $I_1$ are connected to the decoder lines DLII. The decoding operation is carried out in the same manner as for the conventional circuits. With reference to the circuit of FIG. 7 of the present invention, the level of the decoder lines DLII is raised through the emitter-follower transistors $Q_8$, $Q_9$ in the input terminal gates $G_{02}$, $G_{03}$. Therefore, a resistance component which is effective until the rise of the level of the decoder line DLII is very small and the level is allowed to rise very quickly.

Furthermore, the potential in the output terminals $D_{10}$~$D_{25}$ should be at the low level when they are not selected. This requirement can be satisfied by the circuit illustrated in FIG. 7. In addition, the circuit of the present invention enables the level of the decoder line DLII to be quickly raised.

Figure 8:
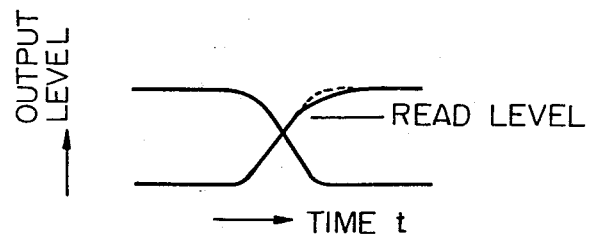
FIG. 8 is a diagram illustrating the output waveform of the decoder circuit according to the present invention.

FIG. 8 is a diagram illustrating the output waveform of the decoder circuit according to the present invention. The output waveform, when it is raised from the low level to the high level, is deformed at a level which is higher than that of conventional circuits. Accordingly, the time when the reading level is reached, is not delayed.

Figure 9:
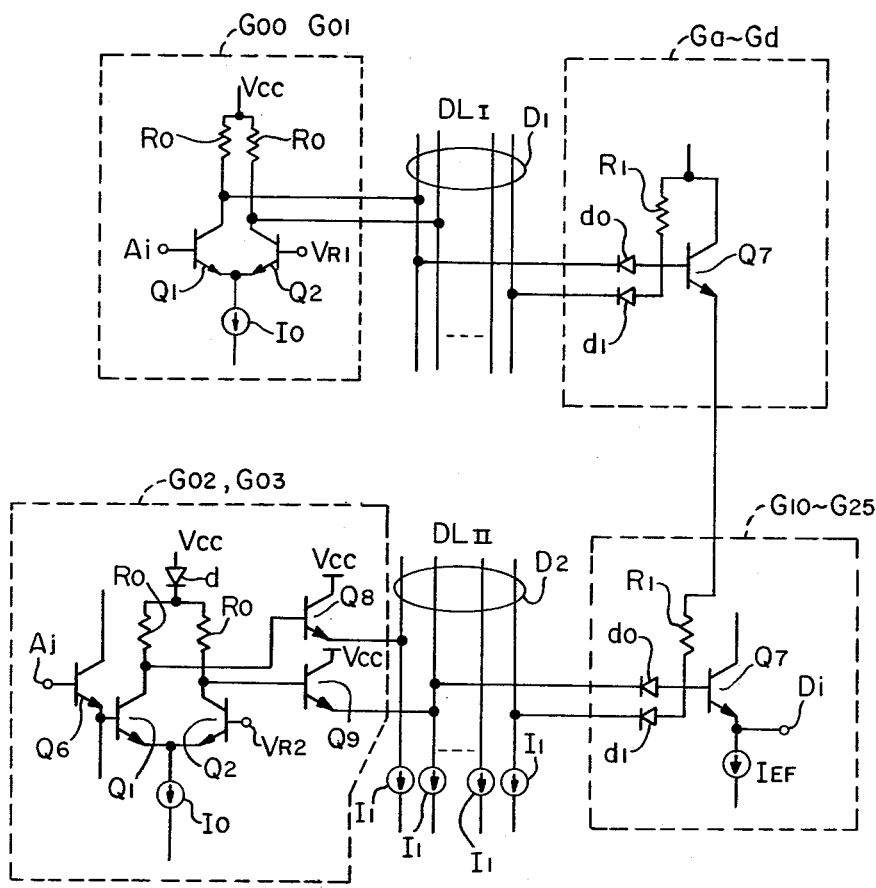
FIG. 9 is a circuit diagram illustrating the decoder according to another embodiment of the present invention.

FIG. 9 is a circuit diagram of another embodiment of the decoder circuit of the present invention in which the decoders Ga~Gd and the second stage gate circuits $G_{10} \sim G_{25}$ are formed by the diode matrix illustrated in FIG. 3D.

According to the present invention, as illustrated in the foregoing, the matrix-type decoder circuit enables the output level to be raised without delay, thereby making it possible to satisfy the requirements of high-speed operation and low power consumption.

I claim:

1. A decoder circuit for a semiconductor memory device, comprising:
   means for providing address signal bits;
   a plurality of input terminal gates for receiving said address signal bits and for providing, as output signals, an address signal and an inverted address signal;
   first decoder lines for decoding the output signals of selected ones of said input terminal gates;
   a first group of multi-emitter transistors, each of which has a first terminal connected to one of said first decoder lines, and which has a second terminal;
   a first group of resistors each of which is connected to said second terminal of a corresponding one of said first group of multi-emitter transistors;
   a power source connected to said first group of resistors;
   a first group of transistors, each of which has a base connected to one of said first group of resistors, said first group of multi-emitter transistors being capable of turning each of said first group of transistors on or off depending upon the potential of said first decoder lines;
   constant current sources;
   second decoder lines connected to said constant current sources;
   emitter follower-connected transistors which are inserted between the power source and said second decoder lines, and which are turned on or off by the output signals of the remainder of said input terminal gates;
   a second group of multi-emitter transistors each of which has a first terminal connected to one of said second decoder lines, and which has a second terminal;
   a second group of resistors each of which is connected to said second terminal of a corresponding one of said second group of multi-emitter transistors and to the emitter of the one of the first group of transistors for driving the corresponding one of said second group of multi-emitter transistors; and
   a group of output transistors each of which has a base connected to one of the second group of resistors, said second group of multi-emitter transistors being capable of turning each of said group of output transistors on or off depending upon the potential of said second decoder lines and upon the emitter potential of the corresponding one of said first group of transistors which drives the corresponding one of said second group of multi-emitter transistors.

2. A decoder circuit for a semiconductor memory device, comprising:
   means for providing address signal bits;
   a plurality of input terminal gates for receiving said address signal bits and for providing, as output signals, an address signal and an inverted address signal;
   first decoder lines for decoding the output signals of selected ones of said input terminal gates;
   a first group of diode matrices, each of which has a first terminal connected to one of said first decoder lines, and which has a second terminal;
   a first group of resistors each of which is connected to said second terminal of a corresponding one of said first group of diode matrices;
   a power source connected to said first group of resistors;
   a first group of transistors, each of which has a base connected to one of said first group of resistors, said first group of diode matrices being capable of turning each of said first group of transistors on or off depending upon the potential of said first decoder lines;
   constant current sources;
   second decoder lines connected to said constant current sources;
   emitter follower-connected transistors which are inserted between the power source and said second decoder lines, and which are turned on or off by the output signals of the remainder of said input terminal gates;
   a second group of diode matrices each of which has a first terminal connected to one of said second decoder lines, and which has a second terminal;
   a second group of resistors each of which is connected to said second terminal of a corresponding one of said second group of diode matrices and to the emitter of the one of the first group of transistors for driving the corresponding one of said second group of diode matrices; and
   a group of output transistors each of which has a base connected to one of the second group of resistors, said second group of diode matrices being capable of turning each of said group of output transistors on or off depending upon the potential of said second decoder lines and upon the emitter potential of the corresponding one of said first group of transistors which drives the corresponding one of said second group of diode matrices.

3. A decoder circuit for a semiconductor memory device, comprising:
   means for providing address signal bits;
   input terminal gate means for receiving said address signal bits and for providing, as an output signal, said address signal bits and inverted address signal bits;
   first decoder lines connected to said input gate means;
   energizing means connected to said first decoder lines for providing, as outputs, drive signals in dependence upon the potential on said first decoder lines;
   emitter follower-connected transistors connected to said input gate means, said emitter follower-connected transistors turned on and off in dependence upon the output signal of said input gate means;
   constant current sources;
   second decoder lines connected to said emitter follower-connected transistors and to said constant current sources;
   output gate means, connected to said energizing means and said second decoder lines, for providing output signals in dependence upon the potential of said second decoder lines and the drive signals from said energizing means.

4. A decoder circuit as set forth in claim 3, wherein said energizing means comprises a plurality of energizing circuits each of which comprises:
- a first multi-emitter transistor, having first and second emitters connected to different ones of said first decoder lines, having a base and having a collector;
- a first resistor connected between the collector and base of said first multi-emitter transistor; and
- a first transistor, having a base connected to the collector of said first multi-emitter transistor, having a collector, and having an emitter connected to said output gate means, for providing one of said drive signals, and wherein said output gate means comprises a plurality of output gate circuits connected to respective ones of said plurality of energizing circuits, each of said output gate circuits comprising:
  - a second multi-emitter transistor, having first and second emitters connected to different ones of said second decoder lines, having a collector and having a base;
  - a second resistor connected between the collector and base of said second multi-emitter transistor and operatively connected to the emitter of said first transistor of said respective one of said plurality of energizing circuits; and
  - a second transistor having a base connected to the collector of said second multi-emitter transistor and having an emitter for providing one of said output signals.

5. A decoder circuit for a semiconductor memory device, comprising:
- means for providing upper and lower address signal bits;
- upper input terminal gates for receiving said upper address signal bits and for providing an upper output address signal;
- lower input terminal gates for receiving said lower address signal bits and for providing a lower output address signal;
- first decoder lines connected to the output of said upper input terminal gates;
- a first multi-emitter transistor decoder circuit connected to said first decoder lines for providing drive signals in dependence upon the potential of said first decoder lines;
- emitter follower-connected transistors connected to the output of said lower input terminal gates, said emitter follower-connected transistors turned on and off in accordance with the lower output address signal;
- constant current sources;
- second decoder lines connected to said constant current sources and said emitter follower-connected transistors; and
- a second multi-emitter transistor decoder circuit connected to said second decoder lines and to said first multi-emitter transistor decoder circuit for providing output signals in dependence upon said drive signals.

6. A decoder circuit as set forth in claim 5, wherein said first multi-emitter transistor decoder circuit comprises a plurality of first multi-emitter transistor circuits, each of which comprises:
- a first multi-emitter transistor, having first and second emitters connected to different ones of said first decoder lines, having a base and having a collector;
- a first resistor connected between the collector and base of said first multi-emitter transistor; and
- a first transistor, having a base connected to the collector of said first multi-emitter transistor, having a collector, and having an emitter for providing one of said drive signals, and wherein said second multi-emitter transistor decoder circuit comprises a plurality of second multi-emitter transistor circuits connected to respective ones of said first multi-emitter transistor circuits, each of said second multi-emitter transistor circuits comprising:
  - a second multi-emitter transistor, having first and second emitters connected to different ones of said second decoder lines, having a collector and having a base;
  - a second resistor connected between the collector and base of said second multi-emitter transistor and operatively connected to the emitter of said first transistor of said respective one of said plurality of first multi-emitter transistor circuits; and
  - a second transistor having a base connected to the collector of said second multi-emitter transistor and having an emitter for providing one of said output signals.

7. A decoder circuit for a semiconductor memory device, comprising:
- means for providing first, second, third and fourth address signal bits;
- first, second, third and fourth input terminal gates for receiving said first, second, third and fourth input address signal bits, respectively, and for providing first, second, third and fourth output address signals, respectively;
- first decoder lines connected to said first and second input terminal gates;
- first, second, third and fourth drive circuits connected to said first decoder lines, for providing first, second, third and fourth drive signals, respectively;
- first and second emitter follower-connected transistors having bases connected to said third and fourth input terminal gates, respectively, and having emitters;
- constant current sources;
- second decoder lines connected to the emitters of said first and second emitter follower-connected transistors and to said constant current sources;
- first, second, third and fourth output terminal gates connected to said second decoder lines and to said first, second, third and fourth drive circuits, respectively, for providing first, second, third and fourth output signals in dependence upon the potential of said second decoder lines and said first, second, third and fourth drive signals, respectively.

8. A decoder circuit as set forth in claim 7, wherein each of said first, second, third and fourth drive circuits comprises:
- a drive multi-emitter transistor having first and second emitters connected to said first decoder lines, having a collector and having a base;
- a drive resistor connected between the collector and base of said drive multi-emitter transistor; and
- a drive transistor having a base connected to the collector of said drive multi-emitter transistor and having an emitter for providing a respective one of said first, second, third and fourth drive signals, and wherein each of said first, second, third and fourth output terminal gates comprises:

an output multi-emitter transistor having first and second emitters connected to said second decoder lines, having a collector and having a base;
an output resistor connected between the collector and base of said output multi-emitter transistor and operatively connected to the emitter of said drive transistor of the respective one of said first, second, third and fourth drive circuits; and
an output transistor having a base connected to the collector of said output multi-emitter transisitor and having an emitter for providing a respective one of said first, second, third and fourth output signals.

* * * * *

UNITED STATES PATENT AND TRADEMARK OFFICE
CERTIFICATE OF CORRECTION

PATENT NO. : 4,385,370
DATED : MAY 24, 1983
INVENTOR(S) : HIDEAKI ISOGAI

It is certified that error appears in the above-identified patent and that said Letters Patent is hereby corrected as shown below:

```
Front page, [30] Foreign Application Priority
          Data, "54/106920" should be --54/106902--.

Col. 1, line 44, after "of" insert --which--;
        line 45, delete "which".
Col. 2, line 17, "usng" should be --using--;
        line 28, after "tion;" insert --and--.
Col. 4, line 45, delete "the" (second occurrence).
```

Signed and Sealed this

Thirtieth Day of August 1983

[SEAL]

Attest:

GERALD J. MOSSINGHOFF

Attesting Officer

Commissioner of Patents and Trademarks